United States Patent
Watarai

[19]

[11] Patent Number: 6,118,327

[45] Date of Patent: Sep. 12, 2000

[54] EMITTER FOLLOWER CIRCUIT HAVING NO TEMPERATURE DEPENDENCY

[75] Inventor: Seiichi Watarai, Tokyo, Japan

[73] Assignee: NEC Corporation, Tokyo, Japan

[21] Appl. No.: 09/148,327

[22] Filed: Sep. 4, 1998

[30] Foreign Application Priority Data

Sep. 22, 1997 [JP] Japan .................................. 9-256626

[51] Int. Cl.[7] .......................... H01L 35/00; H01L 37/00; H03K 3/42; H03K 17/78
[52] U.S. Cl. ............................ 327/513; 327/83; 327/562
[58] Field of Search .................... 327/512, 513, 327/562, 83

[56] References Cited

U.S. PATENT DOCUMENTS

| | | | |
|---|---|---|---|
| 4,672,237 | 6/1987 | Kiyozuka | 326/126 |
| 4,853,646 | 8/1989 | Johnson et al. | 330/256 |
| 5,029,295 | 7/1991 | Bennett et al. | 323/313 |
| 5,831,486 | 11/1998 | Wehbi | 331/57 |
| 5,856,755 | 1/1999 | Falconer et al. | 327/540 |

FOREIGN PATENT DOCUMENTS

| | | |
|---|---|---|
| 48-10963 | 2/1973 | Japan . |
| 7-183763 | 7/1995 | Japan . |

*Primary Examiner*—Toan Tran
*Assistant Examiner*—Quan Tra
*Attorney, Agent, or Firm*—McGinn & Gibb, P.C.

[57] ABSTRACT

In an emitter follower circuit, a bipolar transistor is connected to a resistor element. The bipolar transistor has a temperature dependent characteristic. A current source circuit is connected to the resistor element to flow a current through the resistor element such that a voltage drop by the resistor element has an opposite temperature dependent characteristic to the first temperature dependent characteristic of the bipolar transistor.

20 Claims, 3 Drawing Sheets

EMITTER FOLLOWER CIRCUIT HAVING NO TEMPERATURE DEPENDENCY

BACKGROUND OF THE INVENTION

1. Field of the Invention

The present invention relates to an emitter follower circuit by use of a bipolar transistor.

2. Description of the Related Art

An emitter follower circuit is generally used to decrease output impedance and to shift the level of a signal. The emitter follower circuit is often formed in a semiconductor integrated circuit, and is generally connected between signal processing circuits which are formed in the semiconductor integrated circuit or to an output terminal of the signal processing circuit.

The circuit shown in FIG. 1 is conventionally used as the emitter follower circuit. Referring to FIG. 1, the base of an NPN-type bipolar transistor (to be referred to as an NPN transistor, hereinafter) 501 is connected to an input terminal (IN), and the emitter of the NPN transistor 501 and one of ends of a current source 503 which outputs current of a specific current value is connected to an output terminal (OUT). A power supply terminal (VCC) is connected to the collector of the NPN transistor 501 and a power supply terminal (VEE) is connected to the other end of the current source 503.

As another conventional example, a filter circuit is described in Japanese Laid Open Patent Application (JP-A-Heisei 7-183763). In this reference, bipolar transistors 14 and 22 of an emitter follower circuit are connected to transistors 24 and 26, respectively. The transistors 24 and 26 are supplied with a current generated by a temperature characteristic compensating current generating circuit 30. The temperature characteristic compensating current generating circuit 30 is structured to have the same temperature characteristic as that of output impedance of the transistor 14 or 22. Thus, temperature compensation is performed.

As seen from FIG. 1, a signal is outputted from the output terminal (OUT) to have a signal level lower than a signal level at the input terminal (IN) by the forward direction voltage between the base and the emitter VBE of the NPN transistor 1. That is, in the emitter follower circuit, the signal having a signal level shifted by the forward direction base-emitter voltage VBE from the signal level at the input terminal (IN) is outputted from the output terminal (OUT).

It is known that the forward direction base-emitter voltage VBE of the NPN transistor 1 shown in FIG. 1 has a predetermined temperature dependent drift, and the value of the temperature dependent drift is about −2 mV/° C. with respect to temperature increase.

Now, in FIG. 1, it is supposed that the power supply terminals VCC and VEE are supplied with voltages of 3 V and 0 V, respectively. Also, it is supposed that a signal having the signal level of 3 V is supplied to the input terminal (IN), and a signal having the signal level of 2.1 V is outputted from the output terminal (OUT) when the junction temperature of the emitter follower circuit is 0° C. In case where the junction temperature rises from 0° C. to 100° C., the forward direction base-emitter voltage VBE of the NPN transistor 1 becomes smaller by 0.2 V because of the influence of the above-mentioned temperature dependent drift of the forward direction base-emitter voltage VBE. Thus, the signal outputted from the output terminal (OUT) has the signal level of 2.3 V. That is, there is a problem in that the level shifted voltage with high precision cannot be obtained to the temperature change in the conventional emitter follower circuit shown in FIG. 1.

By the way, the forward direction base-emitter voltage VBE of the NPN transistor 501 necessarily varies due to the change of manufacture condition in the manufacturing process of the NPN transistor 501. It is known that the variance of the forward direction base-emitter voltage VBE has no predetermined tendency and the forward direction base-emitter voltage VBE varies at random. For this reason, in the conventional emitter follower circuit shown in FIG. 1, there is another problem in that the level of the signal outputted from the output terminal (OUT) changes at random due to the change of the forward direction base-emitter voltage VBE so that a level shifted voltage with high precision cannot be obtained.

SUMMARY OF THE INVENTION

The present invention is accomplished in view of the above problems. Therefore, an object of the present invention is to provide a semiconductor integrated circuit including an emitter follower circuit in which a level shifted voltage with high precision can be obtained.

In order to achieve an aspect of the present invention, an emitter follower circuit includes a transistor section containing at least one transistor and having a first temperature dependent characteristic, and a resistor element connected to the transistor section at one of ends of the resistor element. An output signal corresponding to an input signal inputted to the transistor section is outputted from the other end of the resistor element. A current source circuit is connected to the other end of the resistor element, flows a current through the resistor element such that a voltage drop by the resistor element has a second temperature dependent characteristic opposite to the first temperature dependent characteristic of the transistor section.

The transistor section may include a transistor which has a base to which the input signal is inputted, and an emitter which is connected to the one end of the resistor element. Instead, the transistor section may include transistors connected to in a Darlington connection. Otherwise, the transistor section may include a first bipolar transistor which has a base to which the input signal is inputted, and an emitter, and a second bipolar transistor which has a collector connected to the emitter of the first bipolar transistor, a base connected to the collector of the second bipolar transistor, and an emitter connected to the one end of the resistor element.

In the above cases, the current source circuit may flow a current to pass through the resistor element such that a voltage drop by the resistor element has a second temperature dependent characteristic opposite to the first temperature dependent characteristic of the transistor section and such that a variation of the transistor section in a manufacturing process and a variation of the resistor element in the manufacturing process can be cancelled.

The current source circuit may include a transistor section having same temperature dependent characteristic and manufacturing process variation as those of the transistor section, and a resistor element having same temperature dependent characteristic and manufacturing process variation as those of the resistor element. Also, the transistor section of the current source circuit is connected to a stabilized power supply circuit, and the current flowed by the current source circuit is proportional to a current flowing through the resistor element of the current source circuit by the stabilized power supply circuit. In addition, the current flowing through the resistor element of the current source circuit by the stabilized power supply circuit is transferred though a current mirror circuit to the resistor element connected to the current source circuit.

In the above cases, the resistor element and the current source circuit may be formed in a same integrated circuit.

In order to achieve another aspect of the present invention, a method of outputting an output signal having a stable level corresponding to an input signal, includes the steps of:

flowing a first current through a first resistor element from a first bipolar transistor;

transferring a second value corresponding to a first value of the first current; and flowing a second current through a second resistor element from a second bipolar transistor such that a temperature dependent characteristic of the second bipolar transistor can be cancelled, the second bipolar transistor of an emitter follower circuit being used to level shift an input signal to output an level shifted signal.

In this case, the first resistor element and the first bipolar transistor may have same temperature dependent characteristics as those of the second resistor element and the second bipolar transistor, respectively. Instead, the first resistor element and the first bipolar transistor may have same manufacturing process variations as those of the second resistor element and the second bipolar transistor, respectively.

In order to achieve still another aspect of the present invention, an emitter follower circuit includes a transistor section containing at least one transistor and having a first temperature dependent characteristic, and a resistor element connected to the transistor section at one of ends of the resistor element. An output signal corresponding to an input signal inputted to the transistor section being outputted from the other end of the resistor element. A current source circuit is connected to the other end of the resistor element, and flows a current through the resistor element such that a voltage drop by the resistor element has a second temperature dependent characteristic opposite to the first temperature dependent characteristic of the transistor section and such that a variation of the transistor section in a manufacturing process and a variation of the resistor element in the manufacturing process can be cancelled.

DESCRIPTION OF THE PREFERRED EMBODIMENTS

Next, a semiconductor integrated circuit including an emitter follower circuit of the present invention will be described below in detail with reference to the attached drawings.

Figure 1:
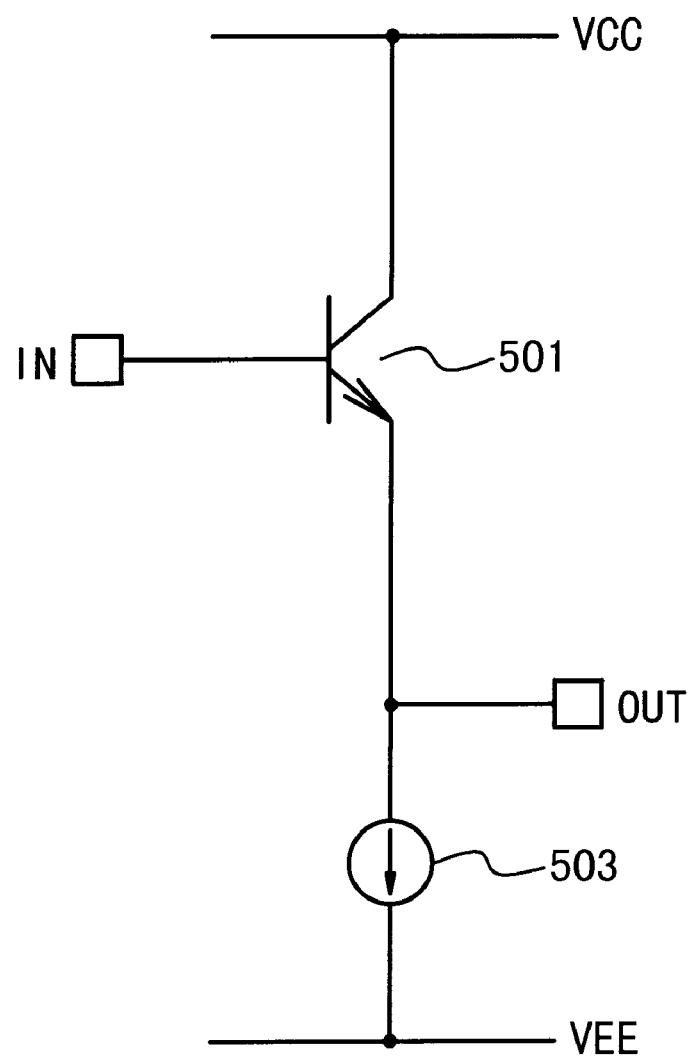
FIG. 1 is a circuit diagram illustrating the structure of a conventional emitter follower circuit.
Figure 2:
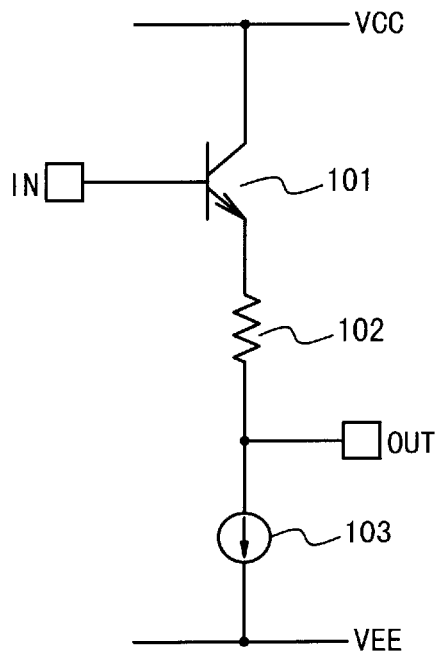
FIG. 2 is a circuit diagram illustrating the structure of an emitter follower circuit according to a first embodiment of the present invention.

FIG. 2 is a circuit diagram illustrating the structure of the emitter follower circuit according to the first embodiment of the present invention.

Referring to FIG. 2, the emitter follower circuit in the first embodiment is composed of an NPN transistor 101, a resistor element 102 and a current source circuit 103. The base of the NPN transistor 101 is connected to an input terminal (IN). The collector of the NPN transistor 101 is connected to a power supply terminal (VCC), and the emitter of the NPN transistor 101 is connected to one of ends of the resistor element 102. The other end of the resistor element 102 is connected to an output terminal (OUT) and one of ends of the current source circuit 103. The other end of the current source circuit 103 is connected to a power supply terminal (VEE).

The temperature dependent drift characteristic of a forward direction base-emitter voltage VBE of the NPN transistor 101 is $-2$ mV/°C. The resistor element 102 and the current source circuit 103 are structured in such a manner that the temperature dependent drift of the electromotive force or voltage drop generated between the ends of the resistor element 102 cancels the temperature dependent drift of the forward direction base-emitter voltage VBE of the NPN transistor 101. Specifically, the temperature dependent drift characteristic of the electromotive force has the value of $+2$ mV/°C. which is the same as the temperature dependent drift characteristic of the forward direction base-emitter voltage VBE of the NPN transistor 101 in magnitude and which is opposite in direction to the temperature dependent drift characteristic of the forward direction base-emitter voltage VBE of the NPN transistor 101.

As mentioned above, the operation of the emitter follower circuit in the first embodiment will be described.

The NPN transistor 101 has the temperature dependent drift characteristic of the forward direction base-emitter voltage VBE of $-2$ mV/°C. On contrary, the temperature dependent drift characteristic of the electromotive force generated by the resistor element 102 is $+2$ mV/°C. As a result, with the signal level which is outputted from the output terminal (OUT), the temperature dependent drift characteristic of the forward direction base-emitter voltage VBE of the NPN transistor 101 is cancelled. Therefore, the emitter follower circuit with high precision as a level shift circuit having a temperature compensation function can be accomplished such that the output signal level from the output terminal (OUT) becomes constant regardless of temperature change.

Figure 3:
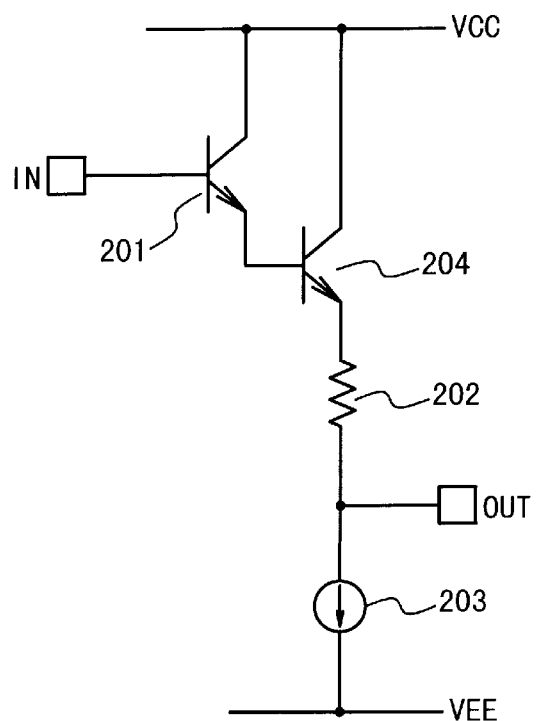
FIG. 3 is a circuit diagram illustrating the structure of the emitter follower circuit according to a second embodiment of the present invention.

Next, the emitter follower circuit according to the second embodiment of the present invention will be described below. FIG. 3 is a circuit diagram illustrating the structure of the emitter follower circuit according to the second embodiment of the present invention.

Referring to FIG. 3, the emitter follower circuit in the second embodiment is composed of the NPN transistors 201 and 204, a resistor element 202 and a current source circuit 203. The base of the NPN transistor 201 is connected to the input terminal (IN). The emitter of the NPN transistor 201 is connected to the base of the NPN transistor 204, and the collector of the NPN transistor 201 is connected to the power supply terminal (VCC) together with the collector of the NPN transistor 204. One of ends of the resistor element 202 is connected to the emitter of the NPN transistor 204, and the other end of the resistor element 202 is connected to the output terminal (OUT) and one of ends of the current source circuit 203. The other end of the current source circuit 203 is connected to the power supply terminal (VEE). The connection of the NPN transistors 201 and 204 is generally called a Darlington connection. When a level shifted voltage should be made larger, the connection is often used.

The temperature dependent drift characteristic of the forward direction base-emitter voltage VBE of each of the NPN transistors 201 and 204 is −2 mV/° C. Accordingly, the total temperature dependent drift characteristic of the forward direction base-emitter voltage becomes −4 mV/° C. in the NPN transistors 201 and 204 which are Darlington-connected. The resistor element 102 and the current source circuit 103 are structured in such a manner that the temperature dependent drift characteristic of the electromotive force generated between the ends of the resistor element 102 cancels the total temperature dependent drift characteristic in the NPN transistors 201 and 204. Specifically, the temperature dependent drift characteristic of the electromotive force has the value of +4 mV/° C. which is the same as the total temperature dependent drift characteristic in the NPN transistors 201 and 204 in magnitude and which is opposite in direction to the total temperature dependent drift characteristic in the NPN transistors 201 and 204.

Next, the operation of the emitter follower circuit in the second embodiment will be described below.

Because each of the NPN transistors 201 and 204 has the temperature dependent drift of −2 mV/° C., the total temperature dependent drift characteristic is −4 mV/° C. to the signal level at the input terminal (IN). On the other hand, the current source circuit 203 acts such that the electromotive force generated between the ends of the resistor element 202 has the temperature dependent drift characteristic of +4 mV/° C. Therefore, the total temperature dependent drift characteristic of the NPN transistors 201 and 204 of the Darlington connection is cancelled so that the output signal level outputted from the output terminal (OUT) has a constant level regardless of temperature change. Thus, even when the NPN transistors 201 and 204 are Darlington-connected, the emitter follower circuit with high precision can be accomplished as a level shift circuit having a temperature compensation function.

Figure 4:
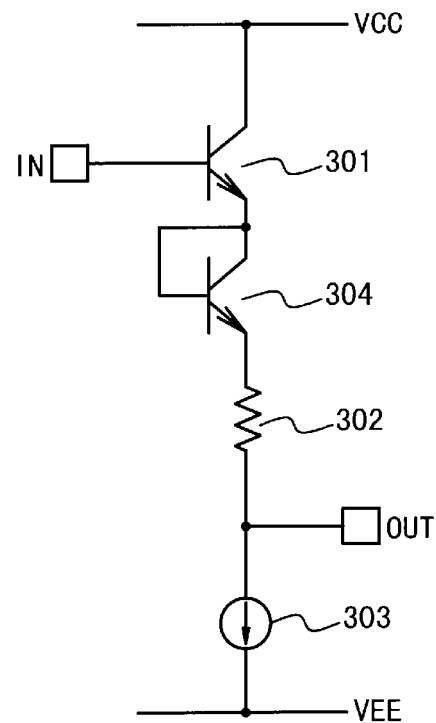
FIG. 4 is a circuit diagram illustrating the structure of the emitter follower circuit according to a third embodiment of the present invention.

Next, the emitter follower circuit according to the third embodiment of the present invention will be described below. FIG. 4 is a circuit diagram illustrating the structure of the emitter follower circuit according to the third embodiment of the present invention.

The emitter follower circuit in the third embodiment is composed of the NPN transistors 301 and 304, a resistor element 302 and a current source circuit 303. In this embodiment, the NPN transistors 301 and 304 are connected in series and the collector of the NPN transistor 304 is connected to the base thereof. Thus, the level shifted voltage which is substantially equivalent to the emitter follower circuit shown in FIG. 3 approximately can be achieved.

In the third embodiment, the base of the NPN transistor 301 is connected to an input terminal (IN). The emitter of the NPN transistor 301 is connected to the base and collector of the NPN transistor 304. The collector of the NPN transistor 301 is connected to a power supply terminal (VCC). One of ends of the resistor element 202 is connected to the emitter of the NPN transistor 304, and the other end of the resistor element 302 is connected to an output terminal (OUT) and one of ends of the current source circuit 203. The other end of the current source circuit 203 is connected to a power supply terminal (VEE).

The temperature dependent drift characteristic of the forward direction base-emitter voltage VBE of each of the NPN transistors 301 and 304 is −2 mV/° C. Accordingly, the total temperature dependent drift characteristic of the NPN transistors 301 and 304 in forward direction base-emitter voltage is −4 mV/° C. On the other hand, the resistor element 302 and the current source circuit 303 are structured in such a manner that the temperature dependent drift characteristic of the electromotive force generated between the ends of the resistor element 302 cancels the total temperature dependent drift characteristic of the NPN transistors 301 and 304. Specifically, the temperature dependent drift characteristic of the electromotive force has the value of +4 mV/° C. which is the same as the total temperature dependent drift characteristic of the NPN transistors 301 and 304 in magnitude and which is opposite in direction to the total temperature dependent drift characteristic of the NPN transistors 301 and 304.

The operation of the emitter follower circuit is similar to that in the second embodiment. Therefore, the description will be omitted.

By the way, in the embodiments described above, the current source circuit generates an output current such that the electromotive force generated between the ends of the resistor element has the temperature dependent drift characteristic of +2 mV/° C. or +4 mV/° C. The emitter follower circuit including the current source circuit which generates such an output current, according to the fourth embodiment of the present invention will be described below with reference to FIG. 5.

Figure 5:
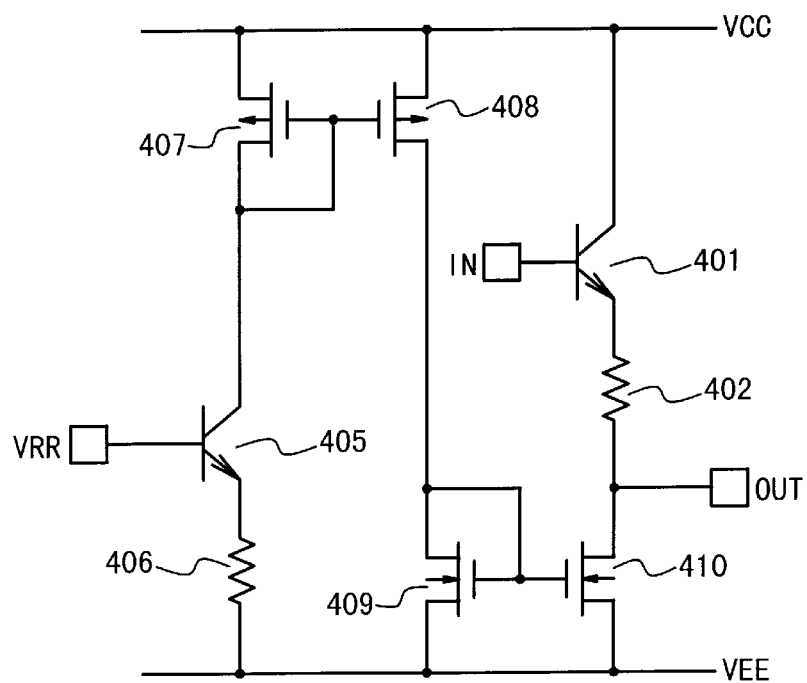
FIG. 5 is a circuit diagram illustrating the structure of the emitter follower circuit according to a fourth embodiment of the present invention.

Referring to FIG. 5, the emitter follower circuit in the fourth embodiment is equivalent to the emitter follower circuit in the first embodiment shown in FIG. 2. The NPN transistors 401 and the resistor element 402 in FIG. 5 are equivalent to the NPN transistor 101 and the resistor element 102 in FIG. 2, respectively. Also, the current source circuit 103 shown in FIG. 2 is formed of an NPN transistor 405, a resistor element 406, PMOS transistors 407 and 408 and NMOS transistors 409 and 410, as shown in FIG. 5.

The components of the current source circuit will be described below. The drain of the NMOS transistor 410 is connected to an output terminal (OUT). The gate of the NMOS transistor 410 is connected to the gate of the NMOS transistor 409. The drain of the NMOS transistor 409 are connected to the drain of the PMOS transistor 408 and the gate of the NMOS transistor 410. The gate of the PMOS transistor 407 is connected to the gate of the PMOS transistor 408. The collector of the NPN transistor 405 is connected to the gate and drain of the PMOS transistor 407. A stabilization power supply (VRR) is connected to the base of the NPN transistor 405. One of the end of the resistor element 406 is connected to the emitter of the NPN transistor 405. The sources of the NMOS transistors 409 and 410 and the other end of the resistor element 406 are connected to a power supply terminal (VEE). The sources of the PMOS transistors 407 and 408 are connected to a power supply terminal (VCC).

Next, the operation of the emitter follower circuit in the fourth embodiment will be described below.

The stabilization power supply (VRR) supplies a predetermined constant voltage even if the emitter follower circuit receives temperature change and the power supply terminals (VCC and VEE) receive voltage change. The current which is generated by this stabilization power supply (VRR), the NPN transistor 405 and the resistor element 406 is outputted from the emitter of the NPN transistor 405. The current value is shown by the following equation (1) approximately.

$$IC5 = (VRR - VBE5)/R6 \tag{1}$$

where

IC5: the emitter current of the NPN transistor 405,

VRR: the supply voltage of the stabilization power supply,

VBE5: the forward direction base-emitter voltage of the NPN transistor 405, and R6: the resistance value of the resistor element 406.

On the other hand, the output level at the output terminal (OUT) is shown by the following equation (2).

$$VOUT = VIN - VBE - ID10 \times R2 \qquad (2)$$

where

VOUT: the output level at the output terminal (OUT),

VIN: the input level at the input terminal (IN),

ID10: the drain current of the NMOS transistor 410, and

R2: the resistance value of the resistor element 402.

The currents IC5 and ID10 are in the proportional relation and are shown by the following equation (3).

$$ID10 = \alpha \times IC5 \qquad (3)$$

where $\alpha$ is a proportion constant. The reason why the above relation shown by the equation (3) is accomplished is that the ratio of a current flowing through a set of PMOS transistors 407 and 408 of a current mirror circuit and a current flowing through a set of NMOS transistors 409 and 410 can be easily controlled by controlling the ratio of the gate widths of the above MOS transistors. When the equation (2) is rewritten based on the above equations (1) and (3), the following equation (4) is obtained.

$$VOUT = VIN - VBE - \alpha \times (R2/R6) \times (VRR - VBE5) \qquad (4)$$

In order to exclude the temperature dependent drift term from the equation (4), the following equation (5) needs to be satisfied.

$$d(VOUT)/d(T) = -d(VBE)/d(T) + \alpha \times (R2/R6) \times d(VBE5)/d(T) = 0 \qquad (5)$$

where

T: temperature, and d: partial differentiation.

If the transistors are formed in the same integrated circuit, the forward direction base-emitter voltage VBE and the forward direction base-emitter voltage VBE5 show approximately the same manufacturing deviation and temperature dependent drift. Therefore, to meet the equation (5), the following equation (6) should be satisfied.

$$R6 = \alpha \times R2 \qquad (6)$$

That is, if $\alpha$ and the resistance value of the resistor element 406 are controlled to meet the equation (6), the output level at the output terminal (OUT) can be free from influences of the temperature dependent drift and manufacturing deviation of the forward direction base-emitter voltage VBE of the NPN transistor 401. Thus, the level shift circuit with high precision can be obtained.

By the way, if the resistance elements 402 and 406 are formed in the same integrated circuit, the resistance value would show approximately the same manufacturing deviation and temperature dependent drift. Especially, if the resistor elements are formed of the same material, the ratio of resistance values can be easily set by changing element sizes. If the relation of the resistor elements 402 and 406 is expressed by the following equation (7) using this characteristic, the above-mentioned equation (6) is rewritten by the following equation (8).

$$R2 = \beta \times R6 \qquad (7)$$

$$\alpha \times \beta = 1 \qquad (8)$$

That is, if $\alpha$ and $\beta$ are controlled to meet the equation (8), the temperature dependent drift and manufacturing deviation of the forward direction base-emitter voltage VBE of the NPN transistor 401 and resistor element 402 can be removed from the output level at the output terminal (OUT). Thus, the level shift circuit with higher precision can be obtained.

Also, even when an NPN transistor is added to the NPN transistor 401 shown in FIG. 5 to form the Darlington connection as shown in FIG. 3, the temperature dependent drift and manufacturing deviation of the forward direction base-emitter voltages VBE and VBE4 and resistor element 2 can be excluded. This could be understood from the process of deriving the above equation (1) to (8). Thus, the equations (6) and (8) can be rewritten as the following equations (9) and (10), respectively.

$$R6 = \alpha \times R2/2 \qquad (9)$$

$$\alpha \times \beta = 2 \qquad (10)$$

It should be noted that the above description is made using the NPN bipolar transistors. However, they are used only for convenience of the circuit operation explanation. Even if the emitter follower circuit is composed of PNP bipolar transistors, the basic operation is same completely.

Also, the current mirror circuit shown in FIG. 5 uses the PMOS transistors or the NPN transistor. However, this is only an example. A current mirror circuit having another structure may be used. For instance, the current mirror circuit may be composed of the PMOS transistors and a PNP transistor. Also, the current mirror circuit may be composed of the NMOS transistors and an NPN transistor.

As described above, according to the present invention, it is possible to exclude the temperature dependence of the output level by applying a current to a resistance element such that a temperature dependent drift of the forward direction base-emitter voltage of the bipolar transistor of an emitter follower circuit can be cancelled. Thus, a level shifted voltage can be obtained with high precision.

Also, the current source circuit can be composed of bipolar transistors and a resistor element which have the same temperature dependent drift and manufacturing deviation as other bipolar transistors and other resistor element. Therefore, the temperature dependency and manufacturing deviation of the output level can be removed. Thus, a level shifted voltage can be obtained with high precision.

What is claimed is:

1. An emitter follower circuit comprising:

a bipolar transistor section containing at least one bipolar transistor and having a first temperature dependent characteristic;

a resistor element connected to said bipolar transistor section at one of ends of said resistor element, an output signal corresponding to an input signal inputted to said bipolar transistor section being outputted from the other end of said resistor element; and a current source circuit connected to the other end of said resistor element, flowing a current to pass through said resistor element such that a voltage drop by said resistor element has a second temperature dependent characteristic opposite to said first temperature dependent characteristic of said bipolar transistor section.

2. An emitter follower circuit according to claim 1, wherein said bipolar transistor section includes a transistor which has a base to which the input signal is inputted, and an emitter which is connected to the one end of said resistor element.

3. An emitter follower circuit according to claim 1, wherein said bipolar transistor section includes transistors connected to in a Darlington connection.

4. An emitter follower circuit according to claim 1, wherein said bipolar transistor section includes:
   a first bipolar transistor which has a base to which the input signal is inputted, and an emitter; and
   a second bipolar transistor which has a collector connected to the emitter of said first bipolar transistor, a base connected to the collector of said second bipolar transistor, and an emitter connected to the one end of said resistor element.

5. An emitter follower circuit according to claim 1, wherein said current source circuit flows a current to pass through said resistor element such that a voltage drop by said resistor element has said second temperature dependent characteristic opposite to said first temperature dependent characteristic of said bipolar transistor section and such that a variation of said bipolar transistor section in a manufacturing process and a variation of said resistor element in the manufacturing process can be cancelled.

6. An emitter follower circuit according to claim 5, wherein said current source circuit comprises:
   a bipolar transistor circuit having same temperature dependent characteristic and manufacturing process variation as said bipolar transistor section; and
   a resistor device having same temperature dependent characteristic and manufacturing process variation as said resistor element.

7. An emitter follower circuit according to claim 6, wherein said bipolar transistor circuit of said current source circuit is connected to a stabilized power supply circuit, and the current flowed by said current source circuit is proportional to a current flowing through said resistor device of said current source circuit by said stabilized power supply circuit.

8. An emitter follower circuit according to claim 7, wherein the current flowing through said resistor device of said current source circuit by said stabilized power supply circuit is transferred though a current mirror circuit to said resistor element connected to said current source circuit.

9. An emitter follower circuit according to claim 5, wherein said resistor element and said current source circuit are formed in a same integrated circuit.

10. A method of outputting an output signal having a stable level corresponding to an input signal, comprising:
   flowing a first current through a first resistor element from a first bipolar transistor;
   transferring a second value corresponding to a first value of said first current; and
   flowing a second current through a second resistor element from a second bipolar transistor such that a temperature dependent characteristic of said second bipolar transistor can be cancelled, said second bipolar transistor of an emitter follower circuit being used to level shift an input signal to output a level shifted signal.

11. A method according to claim 10, wherein said first resistor element and said first bipolar transistor have same temperature dependent characteristics as those of said second resistor element and said second bipolar transistor, respectively.

12. A method according to claim 10, wherein said first resistor element and said first bipolar transistor have same manufacturing process variations as those of said second resistor element and said second bipolar transistor, respectively.

13. An emitter follower circuit comprising:
   a bipolar transistor section containing at least one bipolar transistor and having a first temperature dependent characteristic;
   a resistor element connected to said bipolar transistor section at one of ends of said resistor element, an output signal corresponding to an input signal inputted to said bipolar transistor section being outputted from the other end of said resistor element; and
   a current source circuit connected to the other end of said resistor element, flowing a current to pass through said resistor element such that a voltage drop by said resistor element has a second temperature dependent characteristic opposite to said first temperature dependent characteristic of said bipolar transistor section and such that a variation of said bipolar transistor section in a manufacturing process and a variation of said resistor element in the manufacturing process can be cancelled.

14. An emitter follower circuit according to claim 13, wherein said bipolar transistor section includes a transistor which has a base to which the input signal is inputted, and an emitter which is connected to the one end of said resistor element.

15. An emitter follower circuit according to claim 13, wherein said bipolar transistor section includes transistors connected to in a Darlington connection.

16. An emitter follower circuit according to claim 13, wherein said bipolar transistor section includes:
   a first bipolar transistor which has a base to which the input signal is inputted, and an emitter; and
   a second bipolar transistor which has a collector connected to the emitter of said first bipolar transistor, a base connected to the collector of said second bipolar transistor, and an emitter connected to the one end of said resistor element.

17. An emitter follower circuit according to claim 13, wherein said current source circuit comprises:
   a bipolar transistor circuit having same temperature dependent characteristic and manufacturing process variation as said bipolar transistor section; and
   a resistor device having same temperature dependent characteristic and manufacturing process variation as said resistor element.

18. An emitter follower circuit according to claim 17, wherein said bipolar transistor circuit of said current source circuit is connected to a stabilized power supply circuit, and the current flowed by said current source circuit is proportional to a current flowing through said resistor device of said current source circuit by said stabilized power supply circuit.

19. An emitter follower circuit according to claim 18, wherein the current flowing through said resistor device of said current source circuit by said stabilized power supply circuit is transferred through a current mirror circuit to said resistor element connected to said current source circuit.

20. An emitter follower circuit according to claim 13, wherein said resistor element and said current source circuit are formed in a same integrated circuit.

* * * * *